(12) United States Patent
Cho et al.

(10) Patent No.: US 12,086,350 B2
(45) Date of Patent: Sep. 10, 2024

(54) DISPLAY DEVICE

(71) Applicant: SAMSUNG DISPLAY CO., LTD., Yongin-si (KR)

(72) Inventors: Hyun-Wook Cho, Yongin-si (KR); Min-Hong Kim, Hwaseong-si (KR); Taejoon Kim, Seongnam-si (KR); Jungmok Park, Hwaseong-si (KR); Jinwoo Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/450,877

(22) Filed: Oct. 14, 2021

(65) Prior Publication Data

US 2022/0129133 A1 Apr. 28, 2022

(30) Foreign Application Priority Data

Oct. 28, 2020 (KR) ........................ 10-2020-0141194

(51) Int. Cl.
| | |
|---|---|
| *G06F 3/041* | (2006.01) |
| *G06F 3/044* | (2006.01) |
| *H05K 1/14* | (2006.01) |
| *H05K 1/18* | (2006.01) |
| *H10K 59/40* | (2023.01) |

(52) U.S. Cl.
CPC ......... *G06F 3/04164* (2019.05); *H05K 1/142* (2013.01); *G06F 3/0446* (2019.05); *G06F 2203/04111* (2013.01); *H05K 1/18* (2013.01); *H05K 1/189* (2013.01); *H05K 2201/049* (2013.01); *H10K 59/40* (2023.02)

(58) Field of Classification Search
CPC .. G06F 3/0412; G06F 3/04164; G06F 3/0446; G06F 2203/04111; H05K 1/142; H05K 1/147; H05K 1/189; H05K 1/18; H05K 2201/049; H05K 2201/10128; H01L 27/323; H01L 27/3276; H10K 59/40
USPC ................................................... 345/173, 76
See application file for complete search history.

(56) References Cited

U.S. PATENT DOCUMENTS

| | | | |
|---|---|---|---|
| 9,870,747 | B2 | 1/2018 | Park et al. |
| 9,904,420 | B2 | 2/2018 | Kim et al. |

(Continued)

FOREIGN PATENT DOCUMENTS

| | | |
|---|---|---|
| JP | 2019109946 | 7/2019 |
| KR | 10-2015-0114632 | 10/2015 |

(Continued)

OTHER PUBLICATIONS

English Translation for KR20180117976A, 2022, pp. 1-10 (Year: 2022).*

*Primary Examiner* — Jimmy H Nguyen
(74) *Attorney, Agent, or Firm* — F. CHAU & ASSOCIATES, LLC

(57) ABSTRACT

A display device includes a display panel, and an input sensor disposed on the display panel. The input sensor includes a detection electrode in an active area of the input sensor, a signal line connected to the detection electrode, a slave chip connected to the signal line and overlapping a non-active area adjacent to the active area, a master chip overlapping the non-active area, and a plurality of connection lines connecting the master chip and the slave chip so that a sensed signal of the detection electrode is delivered to the master chip through the slave chip.

17 Claims, 10 Drawing Sheets

(56) References Cited

U.S. PATENT DOCUMENTS

| | | | |
|---|---|---|---|
| 10,379,669 B2 | 8/2019 | Oh et al. | |
| 2010/0106223 A1* | 4/2010 | Grevious | A61N 1/37229 |
| | | | 343/866 |
| 2012/0154725 A1* | 6/2012 | Jeon | G06F 3/0446 |
| | | | 349/110 |
| 2015/0277606 A1* | 10/2015 | Kim | G06F 3/04164 |
| | | | 345/174 |
| 2019/0212623 A1 | 7/2019 | Kim et al. | |
| 2021/0117047 A1 | 4/2021 | Cho et al. | |

FOREIGN PATENT DOCUMENTS

| | | | | |
|---|---|---|---|---|
| KR | 10-2015-0139136 | | 12/2015 | |
| KR | 20180117976 A | * | 10/2018 | G06F 3/0412 |
| KR | 10-2019-0085196 | | 7/2019 | |
| KR | 10-2092569 | | 3/2020 | |
| KR | 10-2021-0045576 | | 4/2021 | |

* cited by examiner

DISPLAY DEVICE

CROSS-REFERENCE TO RELATED APPLICATIONS

This U.S. non-provisional patent application claims priority under 35 U.S.C. § 119 of Korean Patent Application No. 10-2020-0141194, filed on Oct. 28, 2020 in Korean Intellectual Patent Office, the entire contents of which are hereby incorporated by reference.

BACKGROUND

The present inventive concept relates to a display device, and more particularly, to a display device with improved sensing performance.

Multimedia electronic devices such as televisions, mobile phones, tablets, computers, navigation systems, game machines, and the like have display devices for displaying images.

Recently, portable electronic devices have been widely used, and their functions are becoming more and more diverse. Users are developing electronic devices including a wider display area.

As the area of the display area increases, research to improve the sensing performance of the large display area is conducted.

SUMMARY

The present disclosure provides a display device with improved sensing performance.

According to an embodiment of the inventive concept, a display device includes an input sensor which includes a base layer having an active area and a non-active area adjacent to the active area, a first circuit board and a second circuit board disposed on the non-active area and spaced apart from each other, a first circuit chip mounted on the first circuit board and a second circuit chip mounted on the second circuit board, and one or more connection lines connecting the first circuit chip and the second circuit chip with each other.

In an embodiment, the one or more connection lines include at least one connection line which overlaps the non-active area of the base layer.

In an embodiment, more than one connection line overlaps the non-active area.

In an embodiment, the base layer is of a rectangular shape with a short side extending in a first direction and a long side extending in a second direction different from the first direction. The base layer is divided into a first part and a second part by an imaginary line dividing the long side. The first circuit chip overlaps the non-active area and is disposed on the first part. The second circuit chip overlaps the non-active area and is disposed on the second part. At least one of the one or more connection lines overlaps the non-active area and is disposed on both the first part and the second part.

In an embodiment, the one or more connection lines comprise a power line, a communication line, and a ground line, and the ground line, among the one or more connection lines, extends lengthwise along the long side of the base layer and is the most distant from the active area.

In an embodiment, the input sensor further comprises a plurality of columns of first detection electrodes disposed in the active area, each extending in a first direction, a plurality of rows of second detection electrodes disposed on the active area, each extending in a second direction different from the first direction, a plurality of bridge electrodes, each being disposed at a corresponding one of intersections where the plurality of rows and the plurality of columns intersect with each other, a plurality of first signal lines, each being connected to a corresponding one of the plurality of columns of the first detection electrodes, and a plurality of second signal lines, each being connected to a corresponding one of the plurality of rows of the second detection electrodes.

In an embodiment, some of the plurality of first signal lines is connected to the first circuit chip, and the other is connected to the second circuit chip, and the plurality of second signal lines are connected to the first circuit chip.

In an embodiment, the first circuit chip is a master driving chip, and the second circuit chip is a slave driving chip connected to the master driving chip.

In an embodiment, the one or more connection lines include a communication line through which the first circuit chip and the second circuit chip communicate with each other in a Serial Peripheral Interface (SPI) method or an Inter-Integrated Circuit (I2C) method.

In an embodiment, the base layer includes at least one of an inorganic material and an organic material.

In an embodiment, the first and second circuit boards are flexible circuit boards.

In an embodiment, the base layer is of a rectangular shape with a short side extending in a first direction and a long side extending in a second direction different from the first direction. The base layer is quadrisected into a first part, a second part, a third part, and a fourth part by a first imaginary line dividing the long side and a second imaginary line dividing the short side. The first circuit board and the first circuit chip are disposed on the first part. The second circuit board and the second circuit chip are disposed on the second part. A third circuit board and a third circuit chip mounted on the third circuit board are disposed on the third part. A fourth circuit board and a fourth circuit chip mounted on the fourth circuit board are disposed on the fourth part. One of the first to fourth circuit chips is a master driving chip, and the other three chips are slave driving chips connected to the master driving chip.

In an embodiment, the input sensor further includes one or more second connection lines connecting the second circuit chip and the third circuit chip with each other, and one or more third connection lines connecting the first circuit chip and the fourth circuit chip with each other. At least one of the one or more connection lines, the one or more second connection lines, and the one or more third connection lines is disposed on the non-active area of the base layer.

In an embodiment, the display device further includes a display panel disposed under the base layer of the input sensor and including a light emitting element.

According to an embodiment of the inventive concept, a display device includes an input sensor which includes a base layer including an active area sensing an external input and a non-active area adjacent to the active area, the base layer being divided into a first part and a second part, a first pad part disposed on the first part, a second pad part disposed on the second part, a first circuit board disposed to overlap the first pad part, a second circuit board disposed to overlap the second pad part, a first circuit chip mounted on the first circuit board, and a second circuit chip mounted on the second circuit board. The first circuit chip and the second circuit chip are connected with each other through one or more connection lines, and at least one of the one or more connection lines overlaps the non-active area.

In an embodiment, the one or more connection lines comprise a ground line, and the ground line, among the one or more connection lines, is the most distant from the active area.

In an embodiment, the input sensor further comprises a plurality of columns of first detection electrodes disposed in the active area, each extending in a first direction, a plurality of rows of second detection electrodes disposed in the active area, each extending in a second direction, a plurality of first signal lines, each being connected to a corresponding one of the plurality of columns of the first detection electrodes, a plurality of second signal lines, each being connected to a first end of a corresponding one of the plurality of rows of second detection electrodes, and a plurality of third signal lines, each being connected to a second end of the corresponding one of the plurality of rows, the second end being opposite the first end. The first circuit chip is connected to the plurality of second signal lines and some of the plurality of first signal lines. The second circuit chip is connected to the plurality of third signal lines and the other portions of the plurality of first signal lines.

In an embodiment, the input sensor further comprises a third circuit board disposed on the non-active area and a third circuit chip mounted on the third circuit board.

In an embodiment, the second circuit chip and the third circuit chip are connected to the first circuit chip.

In an embodiment, the display device further includes a display panel disposed under the base layer of the input sensor, and the base layer may be directly disposed on the display panel.

According to an embodiment of the present inventive concept, a display device includes a display panel, and an input sensor disposed on the display panel. The input sensor includes a detection electrode in an active area of the input sensor, a signal line connected to the detection electrode, a slave chip connected to the signal line and overlapping a non-active area adjacent to the active area, a master chip overlapping the non-active area, and a plurality of connection lines connecting the master chip and the slave chip so that a sensed signal of the detection electrode is delivered to the master chip through the slave chip.

In an embodiment, the plurality of connection lines includes a ground line, and the ground line, among the plurality of connection lines is the most distant from the active area.

In an embodiment, the input sensor includes a base layer including the active area and the non-active area, the base layer is of a rectangular shape with a short side and a long side, the plurality of connection lines overlaps the non-active area of the base layer, and the ground line extends along the long side of the base layer. The ground line, among the plurality of connection lines, is closest to the long side of the base layer.

In an embodiment, the input sensor includes a base layer including the active area and the non-active area, the base layer is of a rectangular shape with a short side and a long side, at least one of the plurality of connection lines is disposed outside an outer boundary of the base layer without overlapping the non-active area of the base layer, and the ground line extends along the long side of the base layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
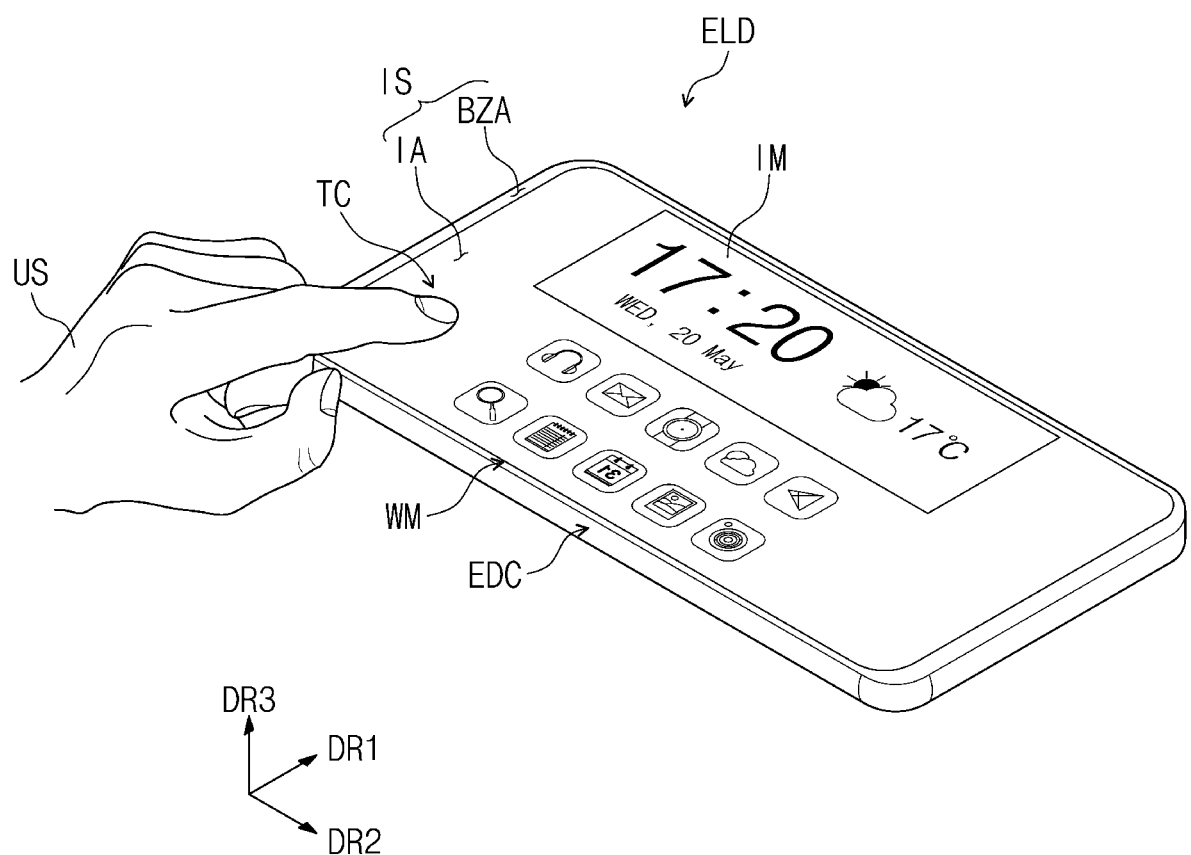
FIG. 1A is a perspective view of an electronic device according to an embodiment of the inventive concept.

Like reference numerals refer to like elements. In the drawings, the thicknesses, proportions, and dimensions of components are exaggerated for effective description. The term "and/or" includes all of one or more combinations defined by related components.

It will be understood that the terms "first" and "second" are used herein to describe various components, but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Figure 1B:
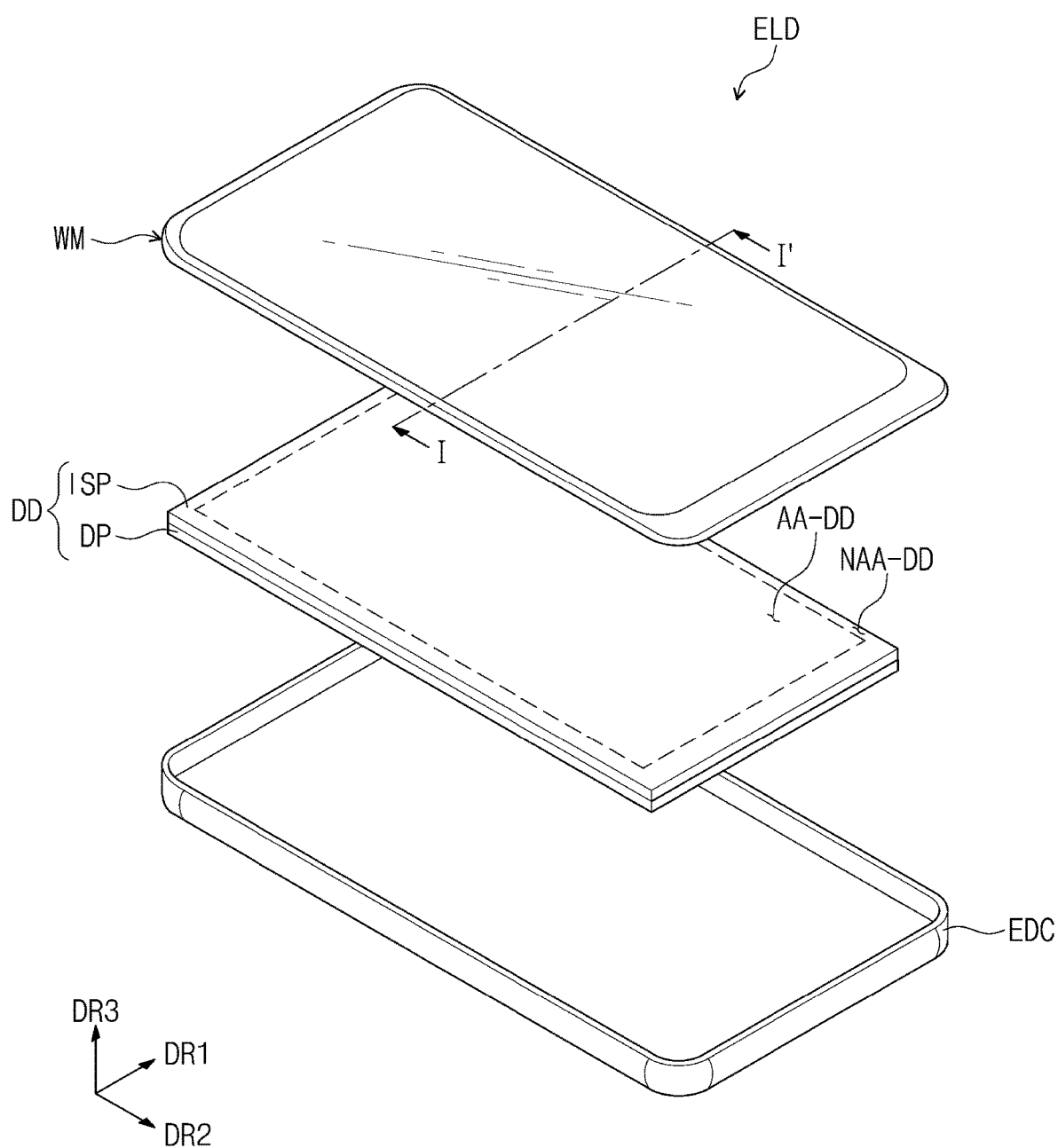
FIG. 1B is an exploded perspective view of an electronic device according to an embodiment of the inventive concept.

FIG. 1A is a perspective view of an electronic device ELD according to an embodiment of the inventive concept. FIG. 1B is an exploded perspective view of the electronic device ELD according to an embodiment of the inventive concept.

Referring to FIGS. 1A and 1B, the electronic device ELD may be a device activated according to an electrical signal. The electronic device ELD may include various embodiments. For example, the electronic device ELD may be applied to electronic devices such as smart phones, tablets, notebook computers, computers, and smart televisions.

The electronic device ELD may display the image IM toward a third direction DR3 which is perpendicular to the display surface IS. First and second directions DR1 and DR2 may be different from each other and may be parallel to the display surface IS. The display surface IS on which the image IM is displayed may correspond to a front surface of the electronic device ELD. The image IM may include a still image as well as a dynamic image.

In this embodiment, the front surface (or upper surface) and the rear surface (or lower surface) of each member are defined based on the direction in which the image IM is displayed. The front and rear surfaces are opposite to each other in the third direction DR3, and a normal direction of each of the front and rear surfaces may be parallel to the third direction DR3.

The separation distance between the front and rear surfaces in the third direction DR3 may correspond to the thickness in the third direction DR3 of the electronic device ELD. The present inventive concept is not limited thereto. For example, the directions indicated by the first to third directions DR1, DR2, and DR3 may be defined differently from those defined in FIG. 1A.

The electronic device ELD may detect an external input applied from the outside. The external input may include various inputs provided from the outside of the electronic device ELD. The electronic device ELD according to the present embodiment may detect an externally applied input TC. In an embodiment, the input TC may be inputted by a finger of the user US. The electronic device ELD may detect the input TC of the user US applied to the side or the rear of the electronic device ELD according to the structure of the electronic device ELD, and is not limited to any embodiment.

In the electronic device ELD according to the present embodiment, the method of the input TC is not limited to a body such as a hand of the user US, and may include any input that may change capacitance, such as a pen.

The front surface of the electronic device ELD may be divided into an image area IA and a bezel area BZA. The image area IA may be an area in which the image IM is displayed. The user US visually recognizes the image IM through the image area IA. In this embodiment, the image area IA is shown in a rectangular shape in which vertices are rounded. However, this is illustrated by way of example, and the image area IA may have various shapes, and is not limited to any embodiment.

The bezel area BZA is adjacent to the image area IA. The bezel area BZA may have a predetermined color. The bezel area BZA may surround the image area IA. Accordingly, the shape of the image area IA may be substantially defined by the bezel area BA. However, this is illustrated as an example, and the bezel area BZA may be disposed adjacent to only one side of the image area IA, or may be omitted. The electronic device ELD according to an embodiment of the inventive concept may include various embodiments, and is not limited to any embodiment.

As shown in FIG. 1B, the electronic device ELD may include a display device DD, a window WM disposed on the display device DD, and a case EDC. The display device DD may include at least a display panel DP and an input sensor ISP.

The display panel DP according to an embodiment of the inventive concept may be a light emitting display panel, and is not particularly limited. For example, the display panel DP may be an organic light emitting display panel or a quantum dot light emitting display panel. The light emitting layer of the organic light emitting display panel may include an organic light emitting material. The light emitting layer of the quantum dot light emitting display panel may include quantum dot, and/or quantum rod. Hereinafter, for the sake of description, the display panel DP is described as an organic light emitting display panel.

The input sensor ISP is disposed above the display panel DP and acquires coordinate information of an external input (e.g., input TC). Hereinafter, a detailed description of the input sensor ISP will be described later.

The display device DD may generate an image IM. The display device DD may include elements for driving pixels of the display device DD, such as a flexible circuit film, a main circuit board, and a driving chip. Hereinafter, a detailed description of the display device DD will be described later.

The window WM may be made of a transparent material capable of emitting an image. For example, the base layer of the window WM may be made of glass, sapphire, plastic, or the like. The window WM is illustrated as a single layer, but is not limited thereto and may include a plurality of layers.

The case EDC may be combined with the window WM. The case EDC absorbs shock applied from the outside and prevents foreign matter/moisture from penetrating into the display device DD to protect the components contained in the case EDC. In an embodiment of the inventive concept, the case EDC may be provided in a form in which a plurality of storage members is combined.

The electronic device ELD according to an embodiment may further include an electronic module including various functional modules for operating the display device DD, a power supply module for supplying power necessary for the overall operation of the electronic device ELD, and a bracket for dividing the internal space of the electronic device ELD by being combined with the display device DD and/or the case EDC.

Figure 2A:
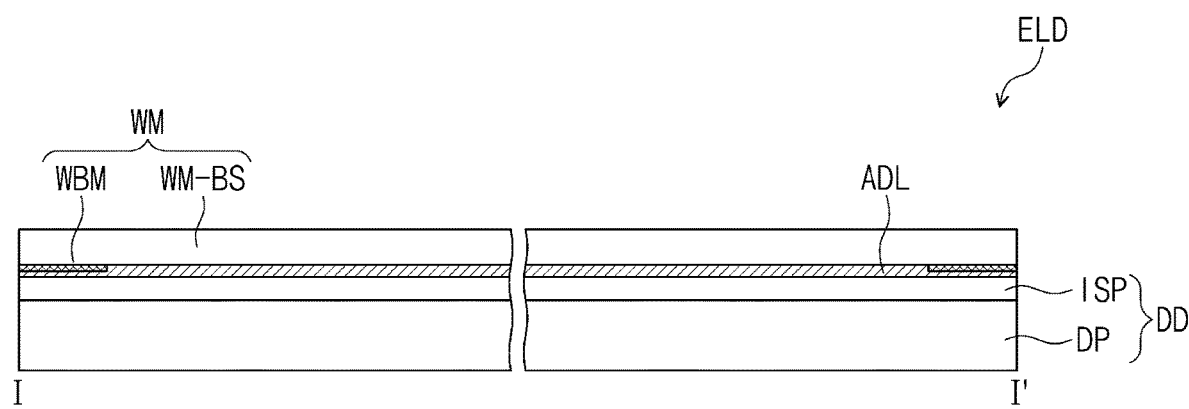
FIGS. 2A and 2B are cross-sectional views of an electronic device taken along line I-I' shown in FIG. 1B according to an embodiment of the inventive concept.

The above-described members may be combined through an adhesive layer ADL (see FIG. 2A). The adhesive layer ADL may include or may be formed of an optically clear adhesive film (OCA). However, the adhesive layer ADL is not limited thereto, and may include or may be formed of an adhesive or pressure-sensitive adhesive. For example, the adhesive layer ADL may include or may be formed of an optically clear resin (OCR) or a pressure sensitive adhesive film (PSA).

An antireflection layer may be further disposed between the window WM and the display device DD. The antireflection layer reduces the reflectance of external light incident from the upper side of the window WM, thereby increasing absorption of the external light. The antireflection layer according to an embodiment of the inventive concept may include a retarder and a polarizer. The retarder may be a film type or a liquid crystal coating type, and may include a $\lambda/2$ retarder and/or a $\lambda/4$ retarder. The polarizer may also be a film type or liquid crystal coating type. The film type may include or may be formed of a stretchable synthetic resin film, and the liquid crystal coating type may include or may be formed of liquid crystals arranged in a predetermined arrangement. The retarder and the polarizer may be implemented as one polarizing film. In an embodiment of the inventive concept, the antireflection layer may include color filters that are directly disposed on the input sensor ISP or the display panel DP, or internalized.

The display device DD may display an image according to an electrical signal and transmit/receive information on an external input. The display device DD may include an active area AA-DD and a peripheral area NAA-DD. An image may be displayed from the active area AA-DD, and an external input may be detected in the active area AA-DD. The active area AA-DD and the peripheral area NAA-DD may correspond to or may overlap the image area IA and the bezel area BZA shown in FIG. 1A, respectively. In the present specification, "an area and an area correspond to each other" means "overlap with each other" and are not limited to having the same area.

The peripheral area NAA-DD is adjacent to the active area AA-DD. For example, the peripheral area NAA-DD may surround the active area AA-DD. However, this is illustrated by way of example, and the peripheral area NAA-DD may be defined in various shapes, and is not limited to any embodiment. According to an embodiment, the active area AA-DD of the display device DD may correspond to or overlap at least a part of the image area IA.

Figure 2B:
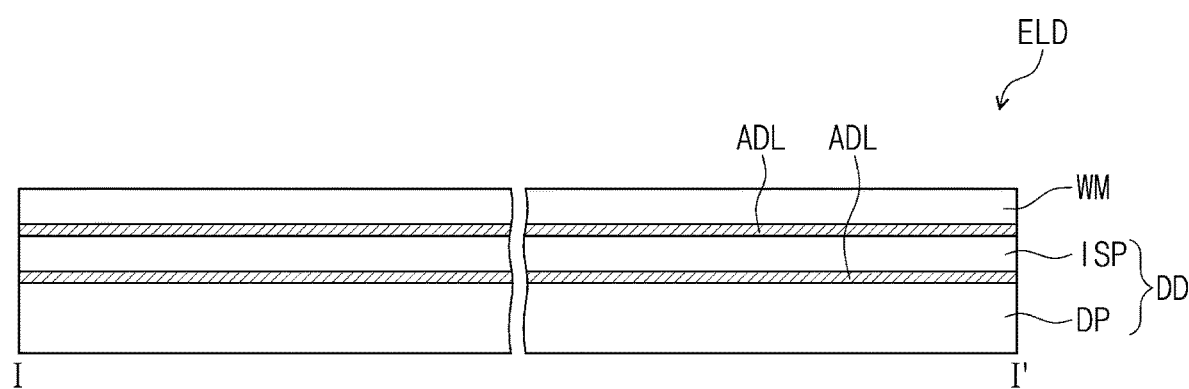

FIGS. 2A and 2B are cross-sectional views of the electronic device ELD taken along line I-I' shown in FIG. 1B.

Referring to FIG. 2A, the window WM may include a light blocking pattern WBM for defining the bezel area BZA (refer to FIG. 1A). The light blocking pattern WBM may be a colored organic film and may be formed on the lower surface of the base layer WM-BS by, for example, a coating method.

An input sensor ISP and a display panel DP may be disposed under the window WM. The input sensor ISP may be formed on the display panel DP through a continuous process. For example, the input sensor ISP may be directly disposed on the display panel DP. In the present specification, "direct arrangement" may be understood as contacting without a separate adhesive layer or adhesive member, and it may be understood that the input sensor ISP contacts the upper surface of the display panel DP without a separate adhesive layer or adhesive member.

However, the embodiment is not limited thereto, and referring to FIG. 2B, an adhesive layer ADL may be disposed between the input sensor ISP and the display panel DP. For example, the input sensor ISP may be manufactured through a process which is separate from a manufacturing process of the display panel DP, and then may be fixed to the upper surface of the display panel DP by the adhesive layer ADL.

Figure 3A:
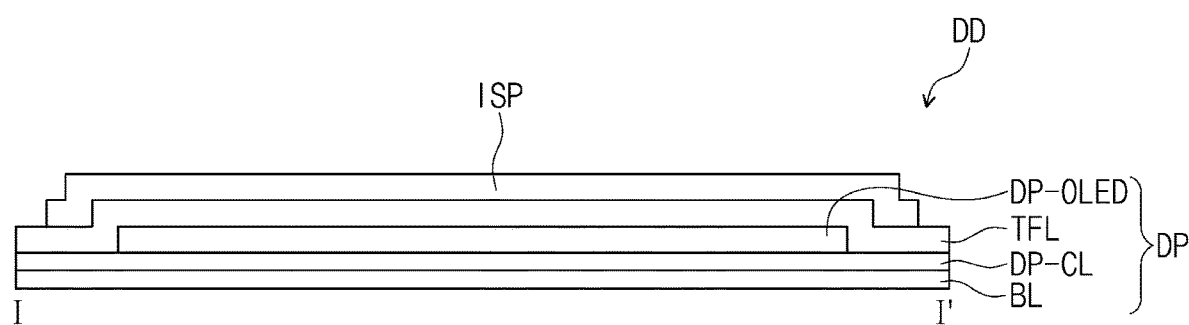
FIGS. 3A and 3B are cross-sectional views of the display device taken along line I-I' shown in FIG. 1B according to an embodiment of the inventive concept.
Figure 3B:
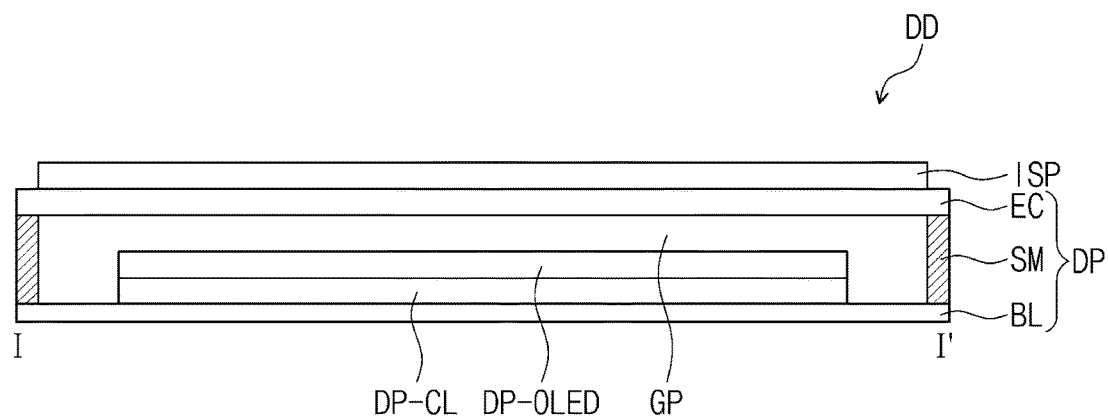

FIGS. 3A and 3B are cross-sectional views of the display device DD along line I-I' shown in FIG. 1B.

Referring to FIG. 3A, the display panel DP of an embodiment includes a base layer (or base substrate) BL, a circuit element layer DP-CL disposed on the base layer BL, a display element layer DP-OLED, and an upper insulating layer TFL. The base layer BL may include or may be formed of at least one plastic film. The base layer BL may include or may be formed of a plastic substrate, a glass substrate, a metal substrate, or an organic/inorganic composite material substrate. For the sake of description, it is assumed that the base layer BL may be a thin glass substrate having a thickness of several tens to several hundreds of micrometers. The base layer BL may have a multilayer structure. For example, the base layer BL may include or may be formed of polyimide, at least one inorganic layer, and polyimide.

The circuit element layer DP-CL may include or may be formed of at least one insulating layer and circuit element. The insulating layer may include or may be formed of at least one inorganic layer and at least one organic layer. The circuit element may include signal lines, pixel driving circuits, and the like. A detailed description of this will be described later.

The display element layer DP-OLED includes at least light emitting elements, such as organic light emitting diodes. The display element layer DP-OLED may further include an organic layer such as a pixel defining film.

The upper insulating layer TFL may include a plurality of thin films. Some thin films may be disposed to improve optical efficiency, and some thin films may be disposed to protect the organic light emitting diodes. The upper insulating layer TFL may include at least an inorganic layer/organic layer/inorganic layer. The upper insulating layer TFL may seal the display element layer DP-OLED.

The input sensor ISP may be directly disposed on the upper insulating layer TFL. An inorganic layer may be further disposed between the input sensor ISP and the upper insulating layer TFL.

However, the embodiment is not limited thereto.

Referring to FIG. 3B, a display panel DP according to an embodiment may include a base layer BL, a circuit element layer DP-CL disposed on the base layer BL, a display element layer DP-OLED, a sealing substrate EC, and a sealant SM.

The sealant SM may couple the base layer BL and the sealing substrate EC to each other.

The sealing substrate EC may be spaced apart from the display element layer DP-OLED with a predetermined gap GP. The base layer BL and the sealing substrate EC may include or may be formed of a plastic substrate, a glass substrate, a metal substrate, or an organic/inorganic composite material substrate. The sealant SM may include or may be formed of an organic adhesive or frit. A predetermined material may be filled in the gap GP. A moisture absorbent or resin material may be filled in the gap GP.

Figure 4:
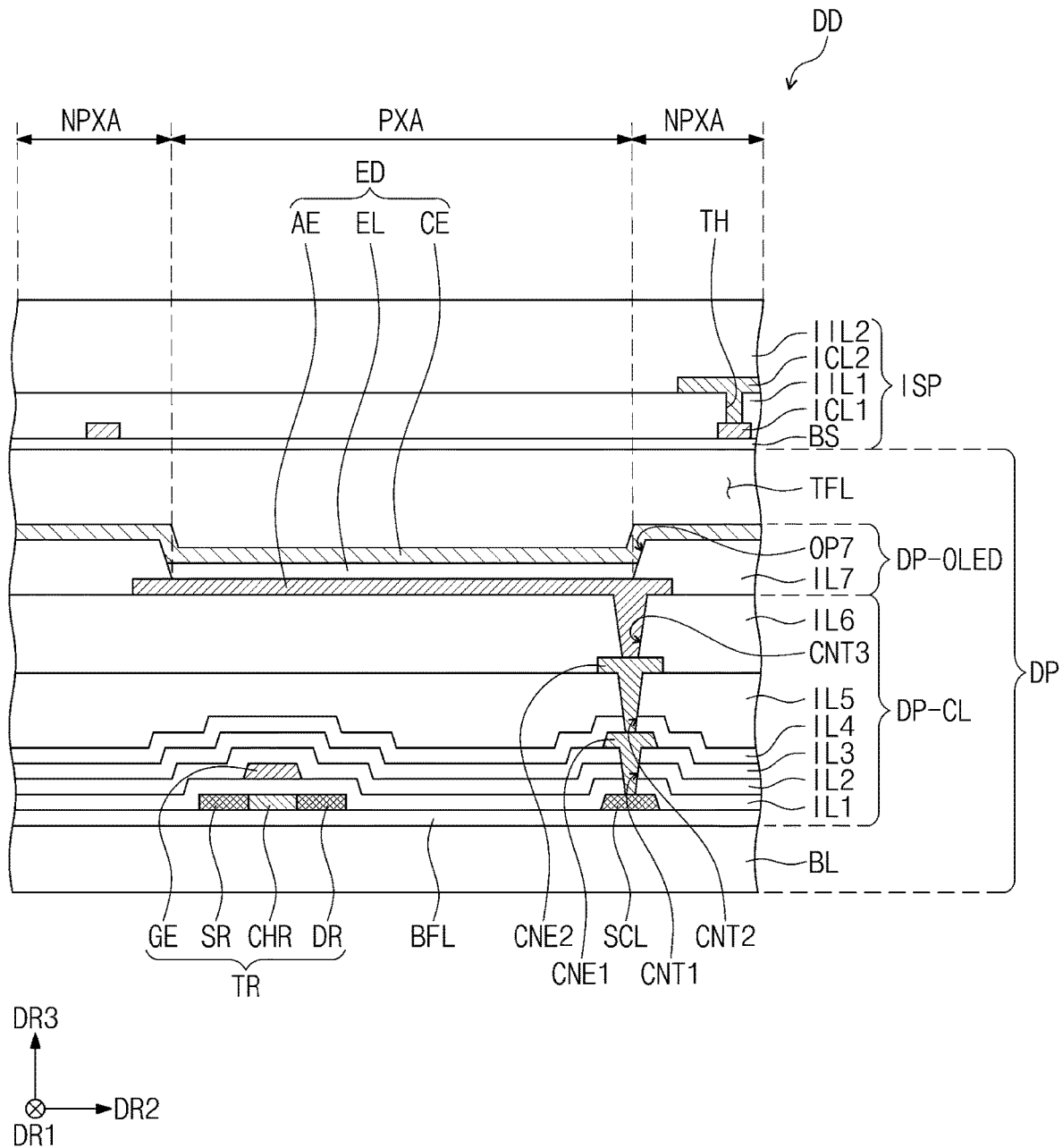
FIG. 4 is an enlarged cross-sectional view of a display device according to an embodiment of the inventive concept.

FIG. 4 is an enlarged cross-sectional view of a display device DD according to an embodiment of the inventive concept.

Referring to FIG. 4, the display device DD according to an embodiment may include a display panel DP and an input sensor ISP disposed on the display panel DP.

The display panel DP may include a base layer BL, a circuit element layer DP-CL, a display element layer DP-OLED, and an upper insulating layer TFL.

The base layer BL may provide a base surface on which the circuit element layer DP-CL is disposed. The circuit element layer DP-CL may be disposed on the base layer BL. The circuit element layer DP-CL may include an insulating layer, a semiconductor pattern, a conductive pattern, and a signal line. An insulating layer, a semiconductor layer, and a conductive layer are formed on the base layer BL by a method such as coating and deposition, and thereafter, the insulating layer, the semiconductor layer, and the conductive layer may be selectively patterned through a plurality of photolithography processes. Thereafter, a semiconductor pattern, a conductive pattern, and a signal line included in the circuit element layer DP-CL may be formed.

At least one inorganic layer is formed on the upper surface of the base layer BL. The inorganic layer may include or may be formed of at least one of aluminum oxide, titanium oxide, silicon oxide, silicon oxynitride, zirconium oxide, and hafnium oxide. The inorganic layer may be formed in multiple layers. The multi-layered inorganic layers may constitute a barrier layer and/or a buffer layer. In an embodiment, the display panel DP includes the buffer layer BFL.

The buffer layer BFL may increase bonding force between the base layer BL and the semiconductor pattern. The buffer layer BFL may include or may be formed of a silicon oxide layer and a silicon nitride layer, and a silicon oxide layer and a silicon nitride layer may be alternately stacked.

The semiconductor pattern may be disposed on the buffer layer BFL. The semiconductor pattern may include or may be formed of polysilicon. However, the inventive concept is not limited thereto, and the semiconductor pattern may include or may be formed of amorphous silicon or metal oxide.

FIG. 4 illustrates only some semiconductor patterns, and semiconductor patterns may be further disposed in other areas. The semiconductor pattern may be arranged in a specific rule across the pixels. Semiconductor patterns may have different electrical properties depending on whether they are doped or not. The semiconductor pattern may include a first area having high conductivity (e.g., electrical conductivity) and a second area having low conductivity (e.g., electrical conductivity). The first area may be doped with an N-type dopant or a P-type dopant. P-type transistors include a doped area doped with a P-type dopant. The second area may be a non-doped area (i.e., an intrinsic semiconductor region) or may be doped with a lower concentration than that of the first area.

The conductivity of the first area is greater than that of the second area, and the first area substantially serves as an electrode or a signal line. The second area may be an active area (or channel area) of the transistor. For example, a part of the semiconductor pattern may be an active area of the transistor, and the other part may be a source area or a drain area of the transistor.

Each of the pixels may have an equivalent circuit including seven transistors, one capacitor, and a light emitting element, and the equivalent circuit diagram of the pixel may be modified in various forms. In FIG. 4, one transistor TR and a light emitting element ED included in a pixel are illustrated by way of example.

The source area SR, the channel area CHR, and the drain area DR of the transistor TR may be formed from a semiconductor pattern. The source area SR and the drain area DR may be provided in opposite sides of the channel area CHR on a cross section. FIG. 4 illustrates a part of the signal line SCL disposed on the same layer as the semiconductor pattern. Although not shown in the drawing separately, the signal line SCL may be electrically connected to the transistor TR on a plane.

The first insulating layer IL1 may be disposed on the buffer layer BFL. The first insulating layer IL1 may overlap a plurality of pixels in common and cover a semiconductor pattern. The first insulating layer IL1 may be an inorganic layer and/or an organic layer, and may have a single layer or multilayer structure. The first insulating layer IL1 may include or may be formed of at least one of aluminum oxide, titanium oxide, silicon oxide, silicon nitride, silicon oxynitride, zirconium oxide, and hafnium oxide. In an embodiment, the first insulating layer IL1 may be a single-layer silicon oxide layer. The first insulating layer IL1 as well as the insulating layer of the circuit element layer DP-CL to be described later may be an inorganic layer and/or an organic layer, and may have a single layer or multilayer structure. The inorganic layer may include or may be formed of at least one of the above-mentioned materials, but is not limited thereto.

The gate GE of the transistor TR is disposed on the first insulating layer IL1. The gate GE may be a part of the metal pattern. The gate GE overlaps the channel area CHR. In the process of doping the semiconductor pattern, the gate GE may function as a mask for doping the semiconductor pattern.

The second insulating layer IL2 is disposed on the first insulating layer IL1 and may cover the gate GE. The second insulating layer IL2 may overlap the pixels in common. The second insulating layer IL2 may be an inorganic layer and/or an organic layer, and may have a single layer or multilayer structure. In an embodiment, the second insulating layer IL2 may be a single-layer silicon oxide layer.

The third insulating layer IL3 may be disposed on the second insulating layer IL2, and in an embodiment, the third insulating layer IL3 may be a single layer of silicon oxide. The first connection electrode CNE1 may be disposed on the third insulating layer IL3. The first connection electrode CNE1 may be connected to the signal line SCL through a contact hole CNT1 penetrating the first, second, and third insulating layers ILL IL2, and IL3.

The fourth insulating layer IL4 may be disposed on the third insulating layer IL3. The fourth insulating layer IL4 may be a single layer of silicon oxide. The fifth insulating layer IL5 may be disposed on the fourth insulating layer IL4. The fifth insulating layer IL5 may be an organic layer.

The second connection electrode CNE2 may be disposed on the fifth insulating layer IL5. The second connection electrode CNE2 may be connected to the first connection electrode CNE1 through a contact hole CNT2 penetrating the fourth insulating layer IL4 and the fifth insulating layer IL5.

The sixth insulating layer IL6 is disposed on the fifth insulating layer IL5 and may cover the second connection electrode CNE2. The sixth insulating layer IL6 may be an organic layer. The display element layer DP-OLED may be disposed on the circuit element layer DP-CL. The display element layer DP-OLED may include a light emitting element ED. For example, the display element layer DP-OLED may include an organic light emitting material, a quantum dot, a quantum rod, a micro LED, or a nano LED. The light emitting element ED may include a first electrode AE, a light emitting layer EL, and a second electrode CE.

The first electrode AE may be disposed on the sixth insulating layer IL6. The first electrode AE may be connected to the second connection electrode CNE2 through a contact hole CNT3 penetrating the sixth insulating layer IL6.

The pixel defining film IL7 is disposed on the sixth insulating layer IL6 and may cover a part of the first electrode AE. An opening part OP7 is defined in the pixel defining film IL7. The opening part OP7 of the pixel defining film IL7 exposes at least a portion of the first electrode AE. In an embodiment, the emission area PXA is defined to correspond to a partial area of the first electrode AE exposed by the opening part OP7. For example, the emission area PXA may vertically overlap a partial area of the first electrode AE exposed by the opening part OP7. The non-emission area NPXA may surround the emission area PXA.

The light emitting layer EL may be disposed on the first electrode AE. The light emitting layer EL may be disposed in the opening part OP7. For example, the light emitting layer EL may be formed separately on each of the pixels. When the light emitting layer EL is formed separately on each of the pixels, each of the light emitting layers EL may emit light of at least one color of blue, red, and green. However, the inventive concept is not limited thereto, and the light emitting layer EL may be connected to the pixels and provided in common. The light emitting layer EL may provide blue light or white light.

The second electrode CE may be disposed on the light emitting layer EL. The second electrode CE has an integral shape and may be commonly disposed on a plurality of pixels. A common voltage may be provided to the second electrode CE, and the second electrode CE may be referred to as a common electrode.

Although not shown in the drawing, a hole control layer may be disposed between the first electrode AE and the light emitting layer EL. The hole control layer may be commonly disposed in the emission area PXA and the non-emission area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in a plurality of pixels using an open mask.

The input sensor ISP according to an embodiment may be directly disposed on the display panel DP. The input sensor ISP may include a base layer BS, a first conductive layer ICL1, a first sensor insulating layer TILL a second conductive layer ICL2, and a second sensor insulating layer IIL2. The base layer BS may be an inorganic layer including any one of silicon nitride, silicon oxynitride, and silicon oxide. Alternatively, the base layer BS may be an organic layer including an epoxy resin, an acrylic resin, or an imide resin. The base layer BS may have a single layer structure or may have a multilayer structure stacked along the third direction DR3.

Each of the first conductive layer ICL1 and the second conductive layer ICL2 may have a single layer structure or may include a plurality of patterns having a multilayer structure stacked along the third direction DR3.

The single-layered conductive layer may include or may be formed of a metal layer or a transparent conductive layer. The metal layer may include or may be formed of molybdenum, silver, titanium, copper, aluminum, or an alloy thereof. The transparent conductive layer may include or may be formed of a transparent conductive oxide such as indium tin oxide (ITO), indium zinc oxide (IZO), zinc oxide (ZnO), indium zinc tin oxide (IZTO), and the like. In addition, the transparent conductive material may include a conductive polymer such as poly(3,4-ethylenedioxythiophene) (PEDOT) or polystyrene sulfonate, metal nanowires, graphene, and the like.

The multilayered conductive layer may include or may be formed of metal layers. The metal layers may have a three-layer structure of, for example, titanium/aluminum/titanium. The multilayered conductive layer may include or may be formed of at least one metal layer and at least one transparent conductive layer.

The first sensor insulating layer IIL1 covers the first conductive layer ICL1, and the second sensor insulating layer IIL2 covers the second conductive layer IIL2. The first sensor insulating layer IIL1 and the second sensor insulating layer IIL2 are illustrated as single layers, but are not limited thereto.

At least one of the first sensor insulating layer IIL1 and the second sensor insulating layer IIL2 may include or may be formed of an inorganic layer. The inorganic layer may include or may be formed of at least one of aluminum oxide, titanium oxide, silicon oxide, silicon nitride, silicon oxynitride, zirconium oxide, and hafnium oxide.

Any one of the first sensor insulating layer IIL1 and the second sensor insulating layer IIL2 may include or may be formed of an organic layer. The organic layer may include or may be formed of at least one of acrylic resin, methacrylic resin, polyisoprene, vinyl resin, epoxy resin, urethane resin, cellulose resin, siloxane resin, polyimide resin, polyamide resin, and perylene resin.

Figure 5A:
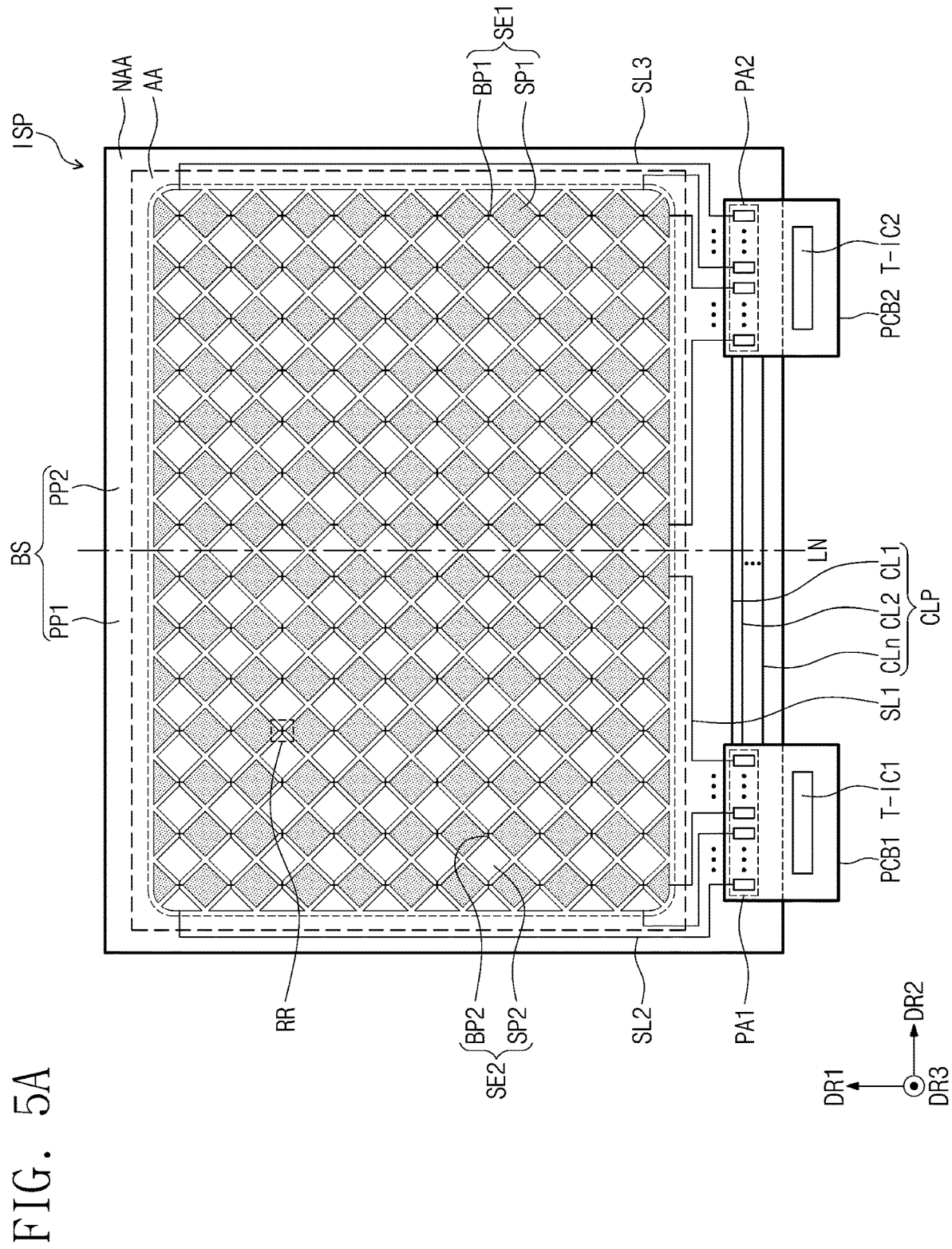
FIG. 5A is a plan view showing an input sensor according to an embodiment of the inventive concept.
Figure 5B:
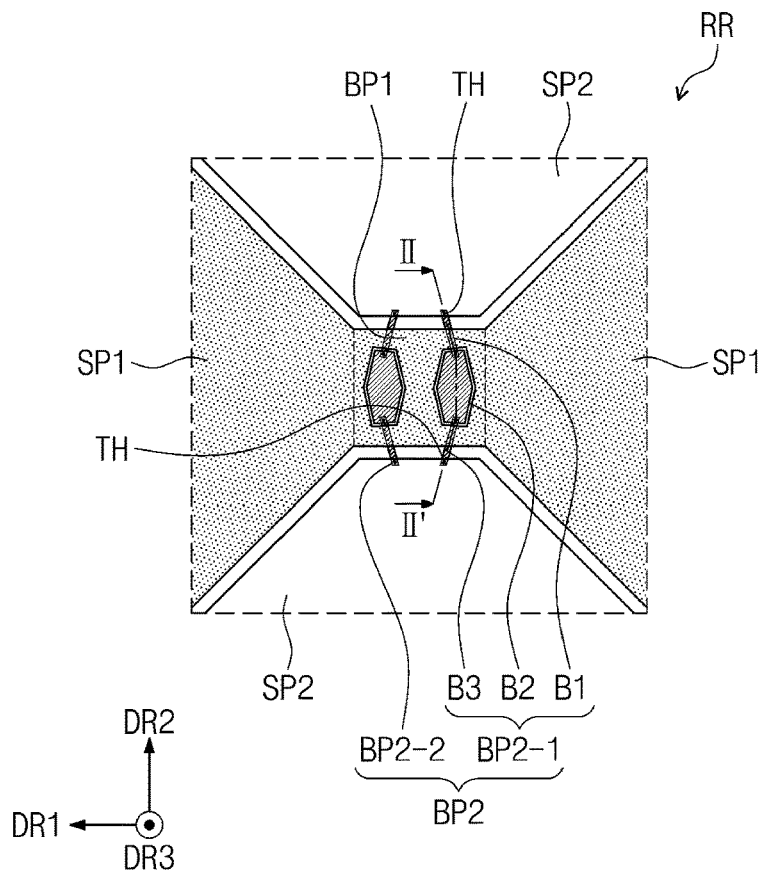
FIG. 5B is a plan view of an enlarged area RR shown in FIG. 5A according to an embodiment of the inventive concept.
Figure 5C:
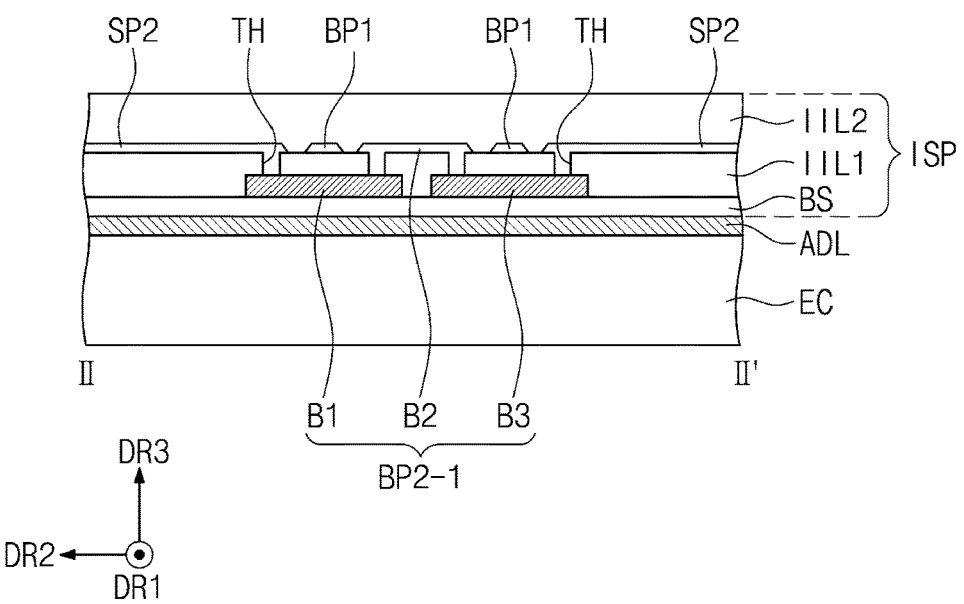
FIG. 5C is a cross-sectional view of an input sensor according to line II-II' shown in FIG. 5A according to an embodiment of the inventive concept.

FIG. 5A is a plan view illustrating an input sensor ISP according to an embodiment of the inventive concept. FIG. 5B is a plan view of an enlarged area RR shown in FIG. 5A. FIG. 5C is a cross-sectional view of an input sensor ISP according to line II-II' shown in FIG. 5B.

Referring to FIG. 5A, an active area AA and a non-active area NAA are defined in the base layer BS of the input sensor ISP. For example, the base layer BS of the input sensor ISP may include the active area AA and the non-active area NAA surrounding the active area AA. The active area AA detects external input. For example, the active area AA may be an area activated according to an electrical signal generated by an external input. The external input may include various types of inputs, such as a part of the user's body (e.g., a finger), light, heat, pen, or pressure. The active area AA and the non-active area NAA may be areas respectively corresponding to the active areas AA-DD and the peripheral areas NAA-DD of the display device DD illustrated in FIG. 1B. For example, the active area AA and the non-active area NAA of the input sensor ISP may vertically overlap the active areas AA-DD and the peripheral areas NAA-DD of the display device DD in the electronic device ELD as shown in FIG. 1A.

In an embodiment, the base layer BS may have a rectangular shape including a long side and a short side. The base layer BS may be bisected or divided into a first part PP1 and a second part PP2 by an imaginary line LN dividing the long side. For example, the imaginary line LN may extend along the first direction DR1 and may be a center line of the base layer BS.

The input sensor ISP may include a plurality of detection electrodes SE1 and SE2 disposed on the base layer BS, and a plurality of signal lines SL1, SL2 and SL3 connected to the plurality of detection electrodes SE1 and SE2.

The plurality of detection electrodes SE1 and SE2 may be disposed in the active area AA. For example, the active area AA may include a plurality of columns of the first detection electrodes SE1, and a plurality of rows of the second detection electrodes SE2. The plurality of rows and the plurality of columns may cross each other. The plurality of detection electrodes SE1 and SE2 may include a plurality of first detection electrodes SE1 and a plurality of second detection electrodes SE2 crossing each other. The first detection electrodes SE1 in each column may extend in the first direction DR1, and the plurality of columns may be spaced apart from each other in the second direction DR2. Each column of the first detection electrodes SE1 may include a plurality of first detection parts SP1 and a plurality of first middle parts BP1 alternately arranged in the first direction DR1. In each column, the plurality of first detection parts SP1 may be spaced apart from each other in the first direction DR1, and each first middle part BP1 may be disposed between a corresponding pair of two first detection parts SP1 adjacent to each other in the first direction DR1, connecting the corresponding pair of the two first detection parts SP1 with each other.

The second detection electrodes SE2 in each row may extend in the second direction DR2, and the plurality of rows may be spaced apart from each other in the first direction DR1. Each row of the second detection electrodes SE2 may include a plurality of second detection parts SP2 and a plurality of second middle parts BP2 alternately arranged in the second direction DR2. In each row, the plurality of second detection parts SP2 may be spaced apart from each other in the second direction DR2, and each second middle part BP2 may be disposed between a corresponding pair of two second detection parts SP2 adjacent to each other in the second direction DR2, connecting the corresponding pair of the two second detection parts SP2 with each other.

FIGS. 5B and 5C may show the structures of the first detection electrodes SE1 and the second detection electrodes SE2.

As shown in FIGS. 5B and 5C, the enlarged area RR corresponds to an intersection area between the first detection electrode SE1 and the second detection electrode SE2. A first middle part BP1 and a second middle part BP2 are arranged in the intersection area. In an embodiment, the first detection part SP1 and the first middle part BP1 may have an integral shape, but are not limited thereto. In an embodiment of the inventive concept, the second detection part SP2 and the second middle part BP2 may have an integral shape.

The second detection part SP2 and the second middle part BP2 separated like the second detection electrode SE2 may be defined as an electrode pattern and a bridge pattern, respectively. In an embodiment, the second detection electrode SE2 includes electrode patterns SP2 and bridge patterns BP2. Although the first bridge pattern BP2-1 and the second bridge pattern BP2-2 arranged in one intersection area are illustrated as an example, the number of bridge patterns BP2 is not particularly limited.

In an embodiment, each of the first and second bridge patterns BP2-1 and BP2-2 may include a first part B1, a second part B2, and a third part B3. The second part B2 may be disposed on a different layer from the first part B1 and the third part B3. In an embodiment, the second part B2 may be positioned at a level which is higher than that of each of the first part B1 and the third part B3. The second part B2 may be disposed on the same layer as the electrode patterns SP2. In an embodiment, the second part B2 may be disposed at the same level as the electrode patterns SP2. The first bridge pattern BP2-1 and the second bridge pattern BP2-2 including a plurality of parts B1, B2, and B3 are illustrated as examples, but are not limited thereto. In an embodiment of the inventive concept, each of the first bridge pattern BP2-1 and the second bridge pattern BP2-2 may be composed of one pattern disposed on the same layer as the first part B1, and this one pattern may connect two spaced apart second detection parts SP2 with each other. In an embodiment, each of the first bridge pattern BP2-1 and the second bridge pattern BP2-2 may be composed of one pattern which is disposed at the same level as the first part B1. The one pattern may overlap the first middle part BP1 without overlapping the first detection part SP1.

As shown in FIGS. 5B and 5C, the input sensor ISP according to an embodiment of the inventive concept may be coupled to the upper surface of the sealing substrate EC by an adhesive layer ADL.

At least a portion of the bridge pattern BP2 is disposed on the upper surface of the base layer BS. The first part B1 and the third part B3 may be disposed on the upper surface of the base layer BS. The first part B1 and the third part B3 may contain or may be formed of metal. The first part B1 and the third part B3 may include or may be formed of titanium (Ti), aluminum (Al), copper (Cu), gold (Au), or silver (Ag). The first part B1 and the third part B3 may be a multilayer structure including a metal layer composed of the metal.

The first sensor insulating layer IIL1 is disposed on the upper surface of the base layer BS. A first detection electrode SE1, electrode patterns SP2, and a second part B2 are disposed on the first sensor insulating layer TILL In the first middle part BP1, an opening part for placing the second part B2 is defined. The electrode patterns SP2 may be connected to the first and third parts B1 and B3 through contact holes TH, and the second part B2 may connect the first and third parts B1 and B3 with each other through contact holes TH. The contact holes TH may penetrate the first sensor insulating layer IIL1.

The first detection electrode SE1, the electrode patterns SP2, and the second part B2 may include or may be formed of the same material. The first detection electrode SE1, the electrode patterns SP2, and the second part B2 may include or may be formed of a transparent conductive oxide (TCO). The first detection electrode SE1, the electrode patterns SP2, and the second part B2 may include or may be formed of PEDOT, metal nanowires, and grapheme in addition to indium tin oxide (ITO), indium zinc oxide (IZO), zinc oxide (ZnO), or indium tin zinc oxide (ITZO).

The second sensor insulating layer IIL2 is disposed on the first sensor insulating layer TILL The second sensor insulating layer IIL2 may cover the first detection electrode SE1, the electrode patterns SP2, and the second part B2. The first sensor insulating layer IIL1 and the second sensor insulating layer IIL2 may include or may be formed of an inorganic material or an organic material.

Referring back to FIG. 5A, a plurality of signal lines SL1, SL2, and SL3 may be connected to the first detection electrodes SE1 and the second detection electrodes SE2.

The plurality of signal lines SL1, SL2, and SL3 may be disposed in the non-active area NAA. The plurality of signal lines SL1, SL2, and SL3 may include a plurality of first signal lines SL1, a plurality of second signal lines SL2, and a plurality of third signal lines SL3.

The first signal lines SL1 may be connected to one ends of opposite ends of the first detection electrodes SE1, respectively. The second signal lines SL2 may be connected to one ends of opposite ends of the second detection electrodes SE2, respectively. The third signal lines SL3 may be connected to the other ends of both ends of the second detection electrodes SE2, respectively.

A first pad part PA1 and a second pad part PA2 may be defined in the non-active area NAA. In an embodiment, the first circuit board PCB1 and the second circuit board PCB2 are disposed to be spaced apart from each other in the non-active area NAA. For example, the first circuit board PCB1 may be disposed on the first pad part PA1, and the second circuit board PCB2 may be disposed on the second pad part PA2. In an embodiment, the first circuit board PCB1 and the second circuit board PCB2 may be flexible circuit boards.

Each of the plurality of first to third signal lines SL1, SL2, and SL3 may be connected to at least one of the first pad part PA1 and the second pad part PA2.

For example, the first signal lines SL1 may be connected to the first circuit board PCB1 and the second circuit board PCB2. In an embodiment, half of the plurality of first signal lines SL1 may be connected to the first circuit board PCB1, and the other half may be connected to the second circuit board PCB2. However, the embodiment is not limited thereto.

The second signal lines SL2 may be connected to the first circuit board PCB1. The third signal lines SL3 may be connected to the second circuit board PCB2.

The first circuit chip T-IC1 is mounted on the first circuit board PCB1, and the second circuit chip T-IC2 is mounted on the second circuit board PCB2.

As the first circuit chip T-IC1 and the second circuit chip T-IC2 are mounted on separate circuit boards, in an embodiment, only the first circuit chip T-IC1 may be mounted on the first circuit board PCB1, and only the second circuit chip T-IC2 may be mounted on the second circuit board PCB2. For example, the sizes of the first circuit board PCB1 and the second circuit board PCB2 may be adjusted to a minimum according to the size of the circuit chips mounted thereon. In an embodiment, the sizes of the first circuit board PCB1 and the second circuit board PCB2 may have a minimum size enough to accompany the first and second circuit chips T-IC1 and T-IC2 mounted thereon, respectively.

Accordingly, the input sensor IPS according to an embodiment may minimize the size of the circuit board disposed on the base layer BS, and minimize the manufacturing cost of the circuit board and the processing cost of the display device. As the size of the circuit board decreases, more space in the display device for the plurality of detection electrodes SE1 and SE2 may be secured.

In an embodiment, each of the plurality of first to third signal lines SL1, SL2, and SL3 may be connected to at least one of the first circuit chip T-IC1 and the second circuit chip T-IC2.

For example, the first signal lines SL1 may be connected to the first circuit chip T-IC1 and the second circuit chip T-IC2. Half of the plurality of first signal lines SL1 may be connected to the first circuit chip T-IC1 and the other half may be connected to the second circuit chip T-IC2. However, the embodiment is not limited thereto.

The second signal lines SL2 may be connected to the first circuit chip T-IC1. The third signal lines SL3 may be connected to the second circuit chip T-IC2. For example, one end of each row of the second detection electrodes SE2 may be connected to a corresponding one of the second signal lines SL2, and the other end may be connected to a corresponding one of the third signal lines SL3. The first and second circuit chips T-IC1 and T-IC2 may cooperatively operate to supply an electrical signal to or receive a sense signal from each row of the second detection electrodes SE2 via the corresponding second signal line SL2 and the corresponding third signal line SL3.

The first circuit chip T-IC1 and the second circuit chip T-IC2 may transmit electrical signals received from the first to third signal lines SL1, SL2, and SL3 to an external electronic module. In an embodiment of the inventive concept, one of the first circuit chip T-IC1 and the second circuit chip T-IC2 may be a master driving chip and the other may be a slave driving chip. For example, the first circuit chip T-IC1 may be a master driving chip, and the second circuit chip T-IC2 may be a slave driving chip. However, embodiments are not limited thereto, and the first circuit chip T-IC1 may be a slave driving chip, and the second circuit chip T-IC2 may be a master driving chip. The input sensor ISP may further include at least one additional circuit board and at least one additional circuit chip. This will be described in detail later.

Hereinafter, an embodiment in which the first circuit chip T-IC1 is a master driving chip and the second circuit chip T-IC2 is a slave driving chip will be described.

The master driving chip may receive information from the slave driving chip and generate data for touch coordinates. For example, the first circuit chip T-IC1 may receive information from the second circuit chip T-IC2 and generate data for touch coordinates. For example, the second circuit chip T-IC2 is connected to the first circuit chip T-IC1 by the connection line CLP. In FIG. 5A, the connection line CLP is shown to be connected to the first circuit board PCB1 and the second circuit board PCB2. For example, the connection line CLP is connected to the first circuit chip T-IC1 and the second circuit chip T-IC2.

A plurality of connection lines CLP may be provided. For example, the connection lines CLP may include first to n-th connection lines CL1 to CLn. For example, 1 or more and 10 or less connection lines CLP may be provided, but embodiments are not limited thereto.

At least one of the plurality of connection lines CLP may be disposed to overlap the non-active area NAA on the base layer BS. For example, at least one connection line CLP may be disposed between the first pad part PA1 and the second pad part PA2, and may be disposed to overlap the non-active area NAA. Each of the connection lines CLP may extend in parallel along the long side of the base layer BS (e.g., the second direction DR2).

FIG. 5A illustrates an embodiment in which all of a plurality of connection lines CLP overlap a non-active area NAA. For example, among the plurality of connection lines CLP, the first connection line CL1 may be disposed at the innermost side of the base layer BS which is adjacent to the active area AA, and the n-th connection line CLn may be adjacent to the outermost side of the base layer BS which is the long side of the base layer BS.

The plurality of connection lines CLP may include a communication line, a power line, a ground line, a synchronization line, and the like. For example, among the plurality of connection lines CLP, the ground line may be disposed on the outermost side of the base layer BS. For example, the n-th connection line CLn may be a ground line. For example, the n-th connection line CLn among the connection lines CLP is closest to the long side (or the outermost side) of the base layer BS, and the first connection line CL1 is the most distant from the long side of the base layer BS. In an embodiment, the n-th connection line CLn extends along the long side of the base layer BS and is closes to the long side of the base layer BS or is the most distant from the active area AA. As the ground line is disposed on the outermost side of the plurality of connection lines CLP, defects of the display device DD due to Electro-Static Discharge (ESD) may be minimized.

However, the embodiment of the input sensor ISP is not limited thereto.

Figure 6:
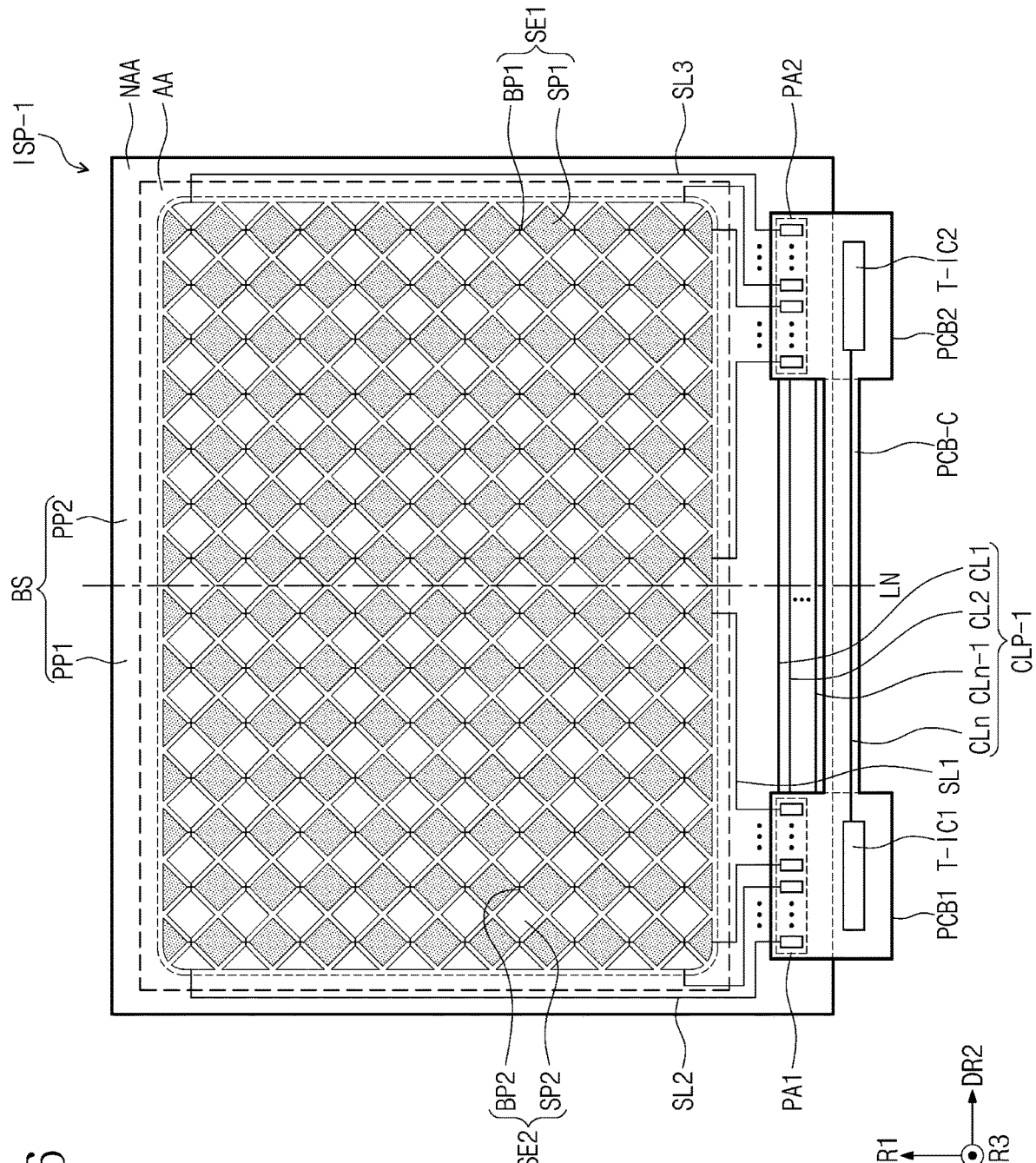
FIGS. 6, 7, and 8 are plan views illustrating an input sensor according to an embodiment of the inventive concept.
Figure 7:
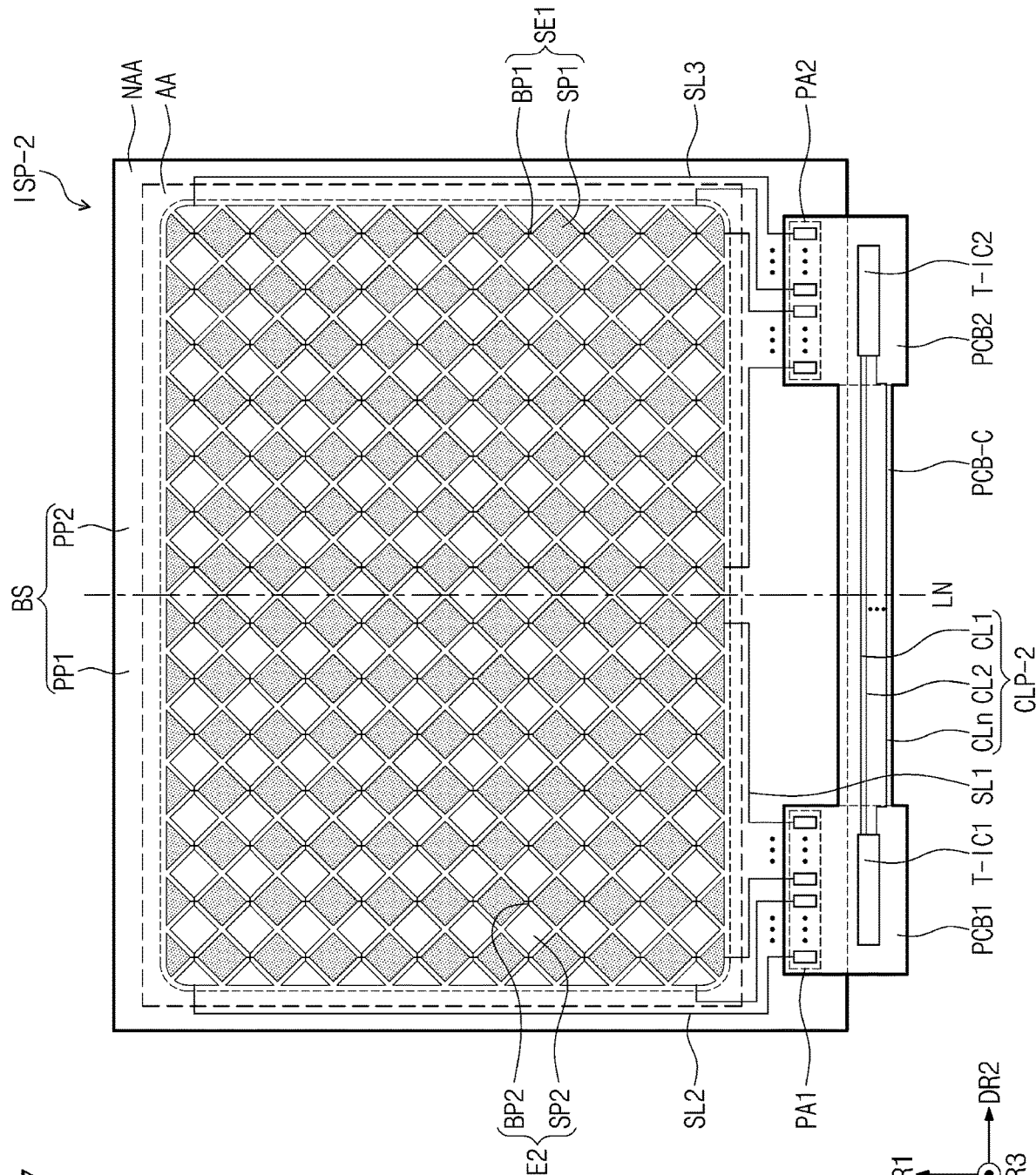
Figure 8:
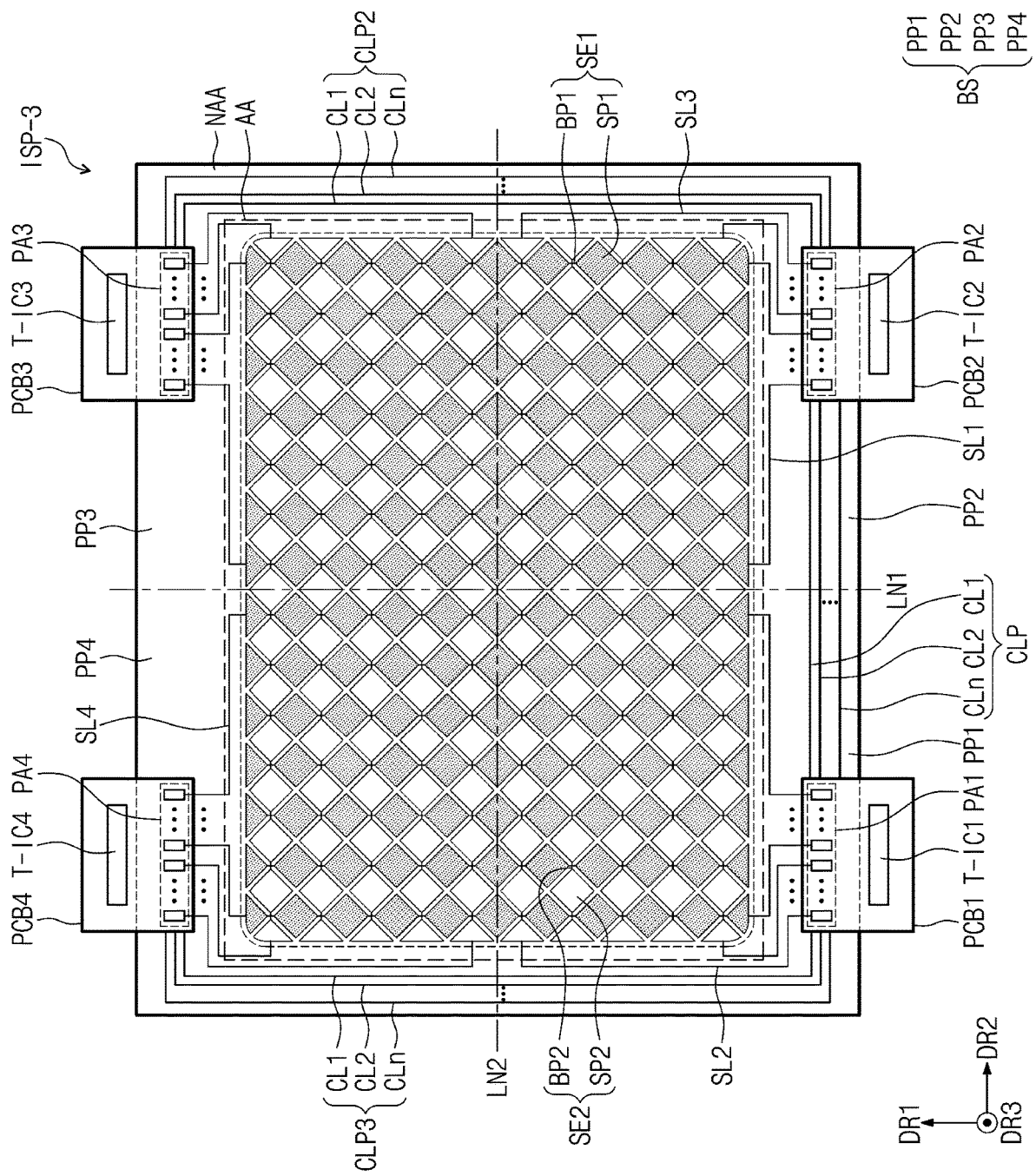

FIGS. 6, 7, and 8 are plan views illustrating input sensors ISP-1, ISP-2, and ISP-3 according to an embodiment of the inventive concept. Among the configurations shown in FIGS. 6 to 8, the above-described contents may be equally applied to the same configuration as in FIGS. 5A to 5C.

Referring to FIG. 6, in the input sensor ISP-1 of an embodiment, the connection line CLP-1 may be provided in plural, and at least one of the plurality of connection lines CLP-1 may be disposed in the non-active area NAA.

For example, among the plurality of connection lines CLP-1, the first to (n−1)-th connection lines CL1 to CLn-1 may be disposed in the non-active area NAA, and the n-th connection line CLn may be disposed outside the base layer BS. Among the connection lines CLP-1, the n-th connection line CLn may be disposed at the outermost side. The n-th connection line CLn may be a ground line. In an embodiment, the first connection line CL1 is closest to the active area AA, and the n-th connection line CLn is the most distant from the active area AA. In an embodiment, the n-th connection line CLn extends along the long side (or the outermost side) of the base layer BS and is the most distant from the active area AA.

The input sensor ISP-1 according to an embodiment may further include a connection circuit board PCB-C so that the n-th connection line CLn may be disposed outside the base layer BS. In an embodiment, the connection circuit board PCB-C may have a shape integral with the first circuit board PCB1 and the second circuit board PCB2. As only the n-th connection line CLn is disposed on the connection circuit board PCB-C, the size of the connection circuit board PCB-C may be adjusted to a minimum. The present invention is not limited thereto. For example, at least two connection lines, including the n-th connection line CLn, among the connection lines CLP-1 may be disposed on the connection circuit board PCB-C. The connection circuit board PCB-C may have a minimum size enough to accommodate the at least two connection lines.

Referring to FIG. 7, in the input sensor ISP-2 of an embodiment, the connection line CLP-2 may be provided in plural, and all of the plurality of connection lines CLP-2 may be disposed outside the base layer BS. The n-th connection line CLn disposed on the outermost side among the plurality of connection lines CLP-2 may be a ground line. In an embodiment, the first connection line CL1 is closest to the active area AA, and the n-th connection line CLn is the most distant from the active area AA. In an embodiment, the n-th connection line CLn extends along the long side (or the outermost side) of the base layer BS and is the most distant from the active area AA.

The input sensor ISP-2 according to an embodiment may further include a connection circuit board PCB-C so that the plurality of connection lines CLP-2 may be disposed outside the base layer BS. In an embodiment, the connection circuit board PCB-C may have a shape integral with the first circuit board PCB1 and the second circuit board PCB2.

Referring to FIG. 8, in the input sensor ISP-3 of an embodiment, by the first imaginary line LN1 bisecting the long side and the second imaginary line LN2 bisecting the short side, the base layer BS may be divided into a first part PP1, a second part PP2, a third part PP3, and a fourth part PP4. For example, the first imaginary line LN1 may extend in the first direction DR1, and the second imaginary line LN2 may extend in the second direction DR2. The first imaginary line LN1 and the second imaginary line LN2 may cross each other at the center of the base layer BS.

The input sensor ISP-3 may include a first circuit board PCB1, a second circuit board PCB2, a third circuit board PCB3, and a fourth circuit board PCB4.

The first circuit board PCB1 may be disposed on the first part PP1 and may overlap the non-active area NAA. The first circuit chip T-IC1 may be mounted on the first circuit board PCB1.

The second circuit board PCB2 may be disposed on the second part PP2 and may overlap the non-active area NAA. A second circuit chip T-IC2 may be mounted on the second circuit board PCB2.

The third circuit board PCB3 may be disposed on the third part PP3 and may overlap the non-active area NAA. A third circuit chip T-IC3 may be mounted on the third circuit board PCB3.

The fourth circuit board PCB4 may be disposed on the fourth part PP4 and may overlap the non-active area NAA. A fourth circuit chip T-IC4 may be mounted on the fourth circuit board PCB4.

In an embodiment, the first circuit chip T-IC1 may be a master driving chip, and the second to fourth circuit chips T-IC2, T-IC3, and T-IC4 may be slave driving chips. However, the embodiment is not limited thereto, and for example, the first circuit chip T-IC1 may be a slave driving chip, and one of the second to fourth circuit chips T-IC2, T-IC3, and T-IC4 may be a master driving chip, and the other two may be slave driving chips.

Hereinafter, an embodiment in which the first circuit chip T-IC1 is a master driving chip, and the second to fourth circuit chips T-IC2, T-IC3, and T-IC4 are slave driving chips will be described.

As the first to fourth circuit chips T-IC1, T-IC2, T-IC3, and T-IC4 are respectively mounted on separate circuit boards, the first to fourth circuit chips T-IC1, T-IC2, T-IC3, and T-IC4 are disposed to be spaced apart from each other. For connection between the master driving chip and the slave driving chip, the input sensor ISP-3 may include a first connection line CLP, a second connection line CLP2, and a third connection line CLP3. The first connection line CLP may connect the first circuit chip T-IC1 and the second circuit chip T-IC2 with each other. The first connection line CLP may have the same role as the above-mentioned connection line CLP.

The second connection line CLP2 may connect the second circuit chip T-IC2 and the third circuit chip T-IC3 with each other. The third circuit chip T-IC3 may be connected to the first circuit chip T-IC1 through the second circuit chip T-IC2. For example, the signal generated by the third circuit chip T-IC3 may be transmitted in the order of the second connection line CLP2 and the first connection line CLP, and may be delivered to the first circuit chip T-IC1.

The third connection line CLP3 may connect the fourth circuit chip T-IC4 and the first circuit chip T-IC1 with each other. For example, the signal generated by the fourth circuit chip T-IC4 may be directly connected to the first circuit chip T-IC1 through the third connection line CLP3.

The input sensor of the inventive concept may include two or more circuit chips spaced apart from each other according to the area of the active area. As the number of circuit chips increases, the distance between the circuit chip and the active area sensed by the circuit chip may decrease, and the sensing sensitivity of the input sensor may be improved.

Further, in the input sensor of the inventive concept, a connection line connecting a plurality of circuit chips spaced apart from each other is disposed in a non-active area, so that the size of the circuit board may be reduced to a minimum and the cost used for the circuit board may be minimized.

The display device of the inventive concept includes the input sensor to improve the sensing capability of the display device and reduce the manufacturing cost of the display device.

In the display device of the inventive concept, sensing performance may be improved, and manufacturing cost of the display device may be minimized.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A display device comprising:
   a base layer including an active area and a non-active area adjacent to the active area;
   a first circuit board and a second circuit board disposed on the non-active area and spaced apart from each other;
   a first circuit chip mounted on the first circuit board and a second circuit chip mounted on the second circuit board,
   wherein the base layer is of a rectangular shape with a short side extending in a first direction and a long side extending in a second direction different from the first direction,
   wherein the base layer is divided into a first part and a second part by a first imaginary line dividing the long side,
   wherein the first circuit board overlaps the non-active area and is disposed on the first part,
   wherein the second circuit board overlaps the non-active area and is disposed on the second part, and
   wherein no intervening circuit chip is disposed between the first circuit chip and the second circuit chip;

more than two connection lines directly connecting the first circuit chip and the second circuit chip with each other,
wherein the more than two connection lines comprise a power line, a communication line, and a ground line, and
wherein the ground line, among the more than two connection lines, extends lengthwise along the long side of the base layer and is the most distant from the active area; and
a connection circuit board partially overlapping the non-active area of the base layer in a vertical direction and physically connecting the first circuit board to the second circuit board,
wherein the connection circuit board is integrated with the first and second circuit boards, and
wherein at least two of the more than two connection lines are disposed on the connection circuit board.

2. The display device of claim 1,
wherein the more than two connection lines include at least one connection line which overlaps the non-active area of the base layer.

3. The display device of claim 2,
wherein the more than two connection lines overlap the non-active area.

4. The display device of claim 1,
wherein at least one of the more than two connection lines overlaps the non-active area and is disposed on both the first part and the second part.

5. The display device of claim 1, further comprising:
a plurality of columns of first detection electrodes disposed in the active area, each column of the first detection electrodes extending in a first direction;
a plurality of rows of second detection electrodes disposed on the active area, each row of the second detection electrodes extending in a second direction different from the first direction;
a plurality of bridge electrodes, each being disposed at a corresponding one of intersections where the plurality of rows and the plurality of columns intersect with each other;
a plurality of first signal lines, each being connected to a corresponding one of the plurality of columns of the first detection electrodes; and
a plurality of second signal lines, each being connected to a corresponding one of the plurality of rows of the second detection electrodes.

6. The display device of claim 5,
wherein some of the plurality of first signal lines are connected to the first circuit chip, and the other is connected to the second circuit chip, and
wherein the plurality of second signal lines are connected to the first circuit chip.

7. The display device of claim 1,
wherein the first circuit chip is a master driving chip, and
wherein the second circuit chip is a slave driving chip connected to the master driving chip.

8. The display device of claim 1,
wherein the more than two connection lines comprise a communication line,
wherein the first circuit chip and the second circuit chip communicate with each other through the communication line in a Serial Peripheral Interface (SPI) method or an Inter-Integrated Circuit (I2C) method.

9. The display device of claim 1,
wherein the base layer comprises at least one of an inorganic material and an organic material.

10. The display device of claim 1,
wherein the first and second circuit boards are flexible circuit boards.

11. The display device of claim 1, further comprising:
a display panel disposed under the base layer and including a light emitting element.

12. A display device comprising:
a base layer including an active area configured to sense an external input and a non-active area adjacent to the active area,
wherein the base layer is divided into a first part and a second part, and
wherein the base layer is of a rectangular shape with a short side extending in a first direction and a long side extending in a second direction different from the first direction;
a first pad part disposed on the first part;
a second pad part disposed on the second part;
a first circuit board disposed to overlap the first pad part;
a second circuit board disposed to overlap the second pad part;
a first circuit chip mounted on the first circuit board;
a second circuit chip mounted on the second circuit board,
wherein the first circuit chip and the second circuit chip are connected with each other through more than two connection lines,
wherein the more than two connection lines comprise a power line, a communication line, and a ground line, and
wherein the ground line, among the more than two connection lines, extends lengthwise along the long side of the base layer and is the most distant from the active area;
a plurality of columns of first detection electrodes disposed in the active area, each column of the first detection electrodes extending in a first direction;
a plurality of rows of second detection electrodes disposed in the active area, each row of the second detection electrodes extending in a second direction;
a plurality of first signal lines, each being connected to a corresponding one of the plurality of columns of the first detection electrodes;
a plurality of second signal lines, each being connected to a first end of a corresponding one of the plurality of rows of second detection electrodes;
a plurality of third signal lines, each being connected to a second end, opposite to the first end, of the corresponding one of the plurality of rows,
wherein the first circuit chip is connected to the plurality of second signal lines and some of the plurality of first signal lines,
wherein the second circuit chip is connected to the plurality of third signal lines and the other portions of the plurality of first signal lines, and
wherein the more than two connection lines directly connect the first circuit chip to the second circuit chip; and
a connection circuit board partially overlapping the non-active area of the base layer and physically connecting the first circuit board to the second circuit board,
wherein the connection circuit board is integrated with the first and second circuit boards, and
wherein at least two of the more than two connection lines are disposed on the connection circuit board.

13. The display device of claim 12, further comprising:
a display panel disposed under the base layer, wherein the base layer is directly disposed on the display panel.

14. A display device comprising: a base layer including an active area and a non-active area adjacent to the active area;
a display panel; and
an input sensor disposed on the display panel,
wherein the input sensor includes:
a plurality of columns of first detection electrodes disposed in an active area of the input sensor, each column of the first detection electrodes extending in a first direction;
a plurality of rows of second detection electrodes disposed in the active area of the input senor, each row of the second detection electrodes extending in a second direction;
a plurality of first signal lines, each being connected to a corresponding one of the plurality of columns of the first detection electrodes;
a plurality of second signal lines, each being connected to a first end of a corresponding one of the plurality of rows of second detection electrodes;
a plurality of third signal lines, each being connected to a second end, opposite to the first end, of the corresponding one of the plurality of rows;
a first circuit board including a single slave chip and overlapping a non-active area adjacent to the active area, wherein the single slave chip is directly connected to the plurality of third signal lines and some of the plurality of first signal lines;
a second circuit board including a master chip and overlapping the non-active area, wherein the master chip is connected to the plurality of second signal lines and the other portions of the plurality of first signal lines, wherein no intervening circuit chip is disposed between the master chip and the single slave chip;
a plurality of connection lines disposed between a first side of the master chip and a second side of the single slave chip and directly connecting the master chip and the single slave chip so that a sensed signal of the first detection electrode and a sensed signal of the second detection electrodes are delivered to the master chip through the single slave chip, wherein the first side of the master chip and the second side of the single slave chip extend parallel to the first direction and face each other in the second direction; and a connection circuit board partially overlapping the non-active area of the base layer in a vertical direction and physically connecting the first circuit board to the second circuit board, wherein the connection circuit board is integrated with the first and second circuit boards, and wherein at least two of the plurality of connection lines are disposed on the connection circuit board.

15. The display device of claim 14,
wherein the plurality of connection lines include a ground line, and
wherein the ground line, among the plurality of connection lines, is the most distant from the active area among the plurality of connection lines.

16. The display device of claim 15,
wherein the input sensor includes a base layer including the active area and the non-active area,
wherein the base layer is of a rectangular shape with a short side and a long side,
wherein the plurality of connection lines overlap the non-active area of the base layer,
wherein the ground line extends along the long side of the base layer, and
wherein the ground line, among the plurality of connection lines, is closest to the long side of the base layer.

17. The display device of claim 15,
wherein the input sensor includes a base layer including the active area and the non-active area,
wherein the base layer is of a rectangular shape with a short side and a long side,
wherein at least one of the plurality of connection lines is disposed outside an outer boundary of the base layer without overlapping the non-active area of the base layer, and
wherein the ground line extends along the long side of the base layer.

* * * * *